United States Patent [19]

Saeed et al.

[11] Patent Number: 5,516,730
[45] Date of Patent: May 14, 1996

[54] PRE-THERMAL TREATMENT CLEANING PROCESS OF WAFERS

[75] Inventors: Saeed Pirooz, St. Louis; Larry W. Shive, St. Peters, both of Mo.

[73] Assignee: MEMC Electronic Materials, Inc., St. Peters, Mo.

[21] Appl. No.: 296,537

[22] Filed: Aug. 26, 1994

[51] Int. Cl.$^6$ ................................................ H01L 21/02
[52] U.S. Cl. .................... 437/235; 437/225; 437/247; 437/939; 437/946; 134/2; 134/26; 156/662.1
[58] Field of Search ............................ 437/946, 225, 437/235, 247, 939; 156/662.1; 134/2, 26

[56] References Cited

U.S. PATENT DOCUMENTS

| | | | |
|---|---|---|---|
| 4,724,171 | 2/1988 | Lampert | 427/299 |
| 4,863,561 | 9/1989 | Freeman et al. | 156/662.1 |
| 4,885,056 | 12/1989 | Hall et al. | 156/662 |
| 4,973,563 | 11/1990 | Prigge et al. | 437/225 |
| 5,051,134 | 9/1991 | Schnegg et al. | 134/3 |
| 5,181,985 | 1/1993 | Lampert et al. | 156/662.1 |
| 5,219,613 | 1/1993 | Fabry et al. | 437/235 |
| 5,275,667 | 1/1994 | Ganesan et al. | 134/1 |
| 5,288,333 | 2/1994 | Tanaka et al. | 134/31 |
| 5,290,361 | 3/1994 | Hayashida et al. | 134/2 |
| 5,308,400 | 5/1994 | Chen | 134/2 |

Primary Examiner—George Fourson
Assistant Examiner—Long Pham
Attorney, Agent, or Firm—Senniger, Powers, Leavitt & Roedel

[57] ABSTRACT

Process for heat-treating a silicon wafer which includes the steps of contacting the surface of the silicon wafer with an aqueous solution containing hydrofluoric acid to remove metals from the wafer surface, contacting the hydrofluoric acid treated wafers with ozonated water to grow a hydrophilic oxide layer on the surface of the silicon wafer, and heating the ozonated water treated wafers to a temperature of at least about 300° C. for a duration of at least about 1 second. The concentration of each of iron, chromium, calcium, titanium, cobalt, manganese, zinc and vanadium, on the surface of the silicon wafer at the initiation of the heating being less than $1 \times 10^9$ atoms/cm$^2$.

1 Claim, No Drawings

5,516,730

PRE-THERMAL TREATMENT CLEANING PROCESS OF WAFERS

BACKGROUND OF THE INVENTION

The present invention relates to wafer cleaning methods, in general, and to a method for cleaning silicon wafers prior to a thermal treatment to minimize the effect upon the minority carrier lifetime.

The preparation of single crystal silicon wafers typically involves the steps of growing a single crystal ingot, slicing the ingot into wafers, lapping, etching and polishing the wafers. Depending upon the required specifications of the electronic device fabricator, the silicon wafers may additionally be subjected to a thermal processing step such as oxygen donor annhilation annealing, thermal processes to control oxygen precipitation, low temperature CVD oxidation, epitaxial deposition, polysilicon deposition and the like.

In such thermal processing steps, the silicon wafers are exposed to a temperature of at least about 300° C. for a duration of at least about one second. Under these conditions, metals such as iron which are present on the surface of the wafer can be driven into the silicon crystal lattice where they can degrade bulk silicon minority carrier lifetime. Ideally, therefore, the silicon wafer surface should be metal-free when it is subjected to a thermal processing step.

In many applications it would additionally be preferred that the silicon wafers subjected to the thermal processing step have a hydrophilic surface. To date, however, this has not been practical. Various limitations associated with the conventional processes used to grow hydrophilic surface layers of silicon oxide have rendered it impractical to grow a hydrophilic silicon oxide layer having a concentration of less than $1\times10^{11}$ atoms/cm$^2$ of metals such as iron and chromium. Consequently, wafers are routinely stripped of their oxide layer prior to thermal processing. This approach, however, is not without its disadvantages; silicon wafers having a hydrophobic surface layer can be prone to localized contamination.

SUMMARY OF THE INVENTION

Among the objects of the invention, therefore, may be noted the provision of a process for heat treating silicon wafers, the provision of such a process in which the silicon wafers have a hydrophilic surface layer of silicon dioxide, and the provision of such a process in which the minority carrier lifetime of the silicon wafer is not materially reduced as a consequence of metal contamination associated with the silicon oxide layer being driven into the bulk silicon during the thermal processing step.

Briefly, therefore, the present invention is directed to a process for heat-treating a silicon wafer. The process comprises the steps of contacting the surface of the silicon wafer with an aqueous solution containing hydrofluoric acid to remove metals from the wafer surface, contacting the hydrofluoric acid treated wafers with ozonated water to grow a hydrophilic oxide layer on the surface of the silicon wafer, and heating the ozonated water treated wafers to a temperature of at least about 300° C. for a duration of at least about 1 second. The concentration of iron, chromium, calcium, titanium, cobalt, manganese, zinc and vanadium, on the surface of the silicon wafer at the initiation of the heating is less than $1\times10^9$ atoms/cm$^2$.

Other objects of the invention will be in part apparent and in part pointed out hereinafter.

DETAILED DESCRIPTION OF THE PREFERRED EMBODIMENTS

Surprisingly, a pre-thermal treatment cleaning process has been discovered which enables the preparation of silicon wafers having a hydrophilic silicon oxide surface and a surface concentration of no more than about $1\times10^9$ atoms/cm$^2$ of any metal which can have a material affect upon the minority carrier lifetime of the silicon. Such metals include iron, chromium, calcium, titanium, cobalt, manganese, zinc and vanadium, particularly iron, chromium and titanium. Advantageously, therefore, the minority carrier-lifetime of silicon wafers which have been pre-treated in accordance with this discovery will not be significantly reduced when they are subjected to a thermal treatment process.

Preferably, the pre-heat treatment cleaning process of the present invention includes the following steps: pre-cleaning (for wafers which are severely contaminated with metals or organic films), metals removal, rinsing, oxide growth, and drying.

The silicon wafers may be pre-cleaned by being immersed in any of a number of cleaning solutions which are well-known to those of ordinary skill. They include piranha mixtures (mixtures of sulfuric acid and hydrogen peroxide) and SC-1 mixtures. The SC-1 cleaning solution contains about 1000:1:1 to 1:1:1 parts by volume $H_2O$: $H_2O_2$: $NH_4OH$, preferably about 100:1:1 to about 5:1:1 parts by volume $H_2O$: $H_2O_2$: $NH_4OH$, (supplied as 30–35 wt % $H_2O_2$ in water and 28–30 wt % $NH_4OH$ in water) and has a temperature of about 0° C. to about 100° C., preferably about 25° C. to 90° C. SC-1 removes organic contaminants and particles by both the solvating action of ammonium hydroxide and the powerful oxidizing action of hydrogen peroxide. The ammonium hydroxide also serves to complex metals such as copper, gold, nickel, cobalt, zinc and calcium.

Metals removal is carried out by contacting the silicon wafers with an aqueous solution containing about 1:1 to 1:10,000 parts by volume HF:$H_2O$ (supplied as 49 wt % HF in water). To enhance metals removal, the solution may additionally contain HCl (1:1:0 to 1:1:10,000 parts by volume HF:HCl:$H_2O$, supplied as 36.5–38 wt % HCl in water), $H_2O_2$ (1:1:0 to 1:1:10,000 parts by volume HF:$H_2O_2$: $H_2O$, supplied as 30–35 wt % $H_2O_2$ in water), or ozone (about 0.1 to about 50 ppm). Preferably, the metals removal solution contains about 5:40:400 parts by volume HF:HCl:$H_2O$ (supplied as 49 wt % HF in water and 36.5–38 wt % HCl in water). The solution may be at a temperature of about 10° C. to about 90° C., preferably about 25° C. to about 60° C. and the silicon wafers are immersed in a flowing bath of this solution for a period of at least about 0.1 minutes, preferably about 2 to about 10 minutes. These solutions effectively remove alkali and transition metals, and prevent redeposition from the solution by forming soluble metal complexes.

After metals removal, the silicon wafers are rinsed for a period of at least about 0.1 minutes and typically about 2 to about 10 minutes in deionized water. The water preferably has a resistivity of about 3 to about 18 mega-Ohms, preferably greater than about 17 mega-Ohms.

The rinsed wafers are contacted with high purity ozonated water, i.e., deionized water containing ozone and having a concentration of no more than about 0.01 parts per billion (weight/volume) of each of iron, chromium, titanium and other metals which will degrade minority carrier lifetime, to produce a wafer having a hydrophilic oxide surface. The resulting silicon oxide layer preferably has a thickness of about 0.6 to about 1.5 nanometers and a concentration of no more than $1\times10^9$, more preferably no more than about $1\times10^8$ of each of iron, chromium, titanium and other metals which degrade minority carrier lifetime. Silicon oxide layers of this thickness and purity may be produced by immersing the wafers in a bath containing about 0.1 parts per million (ppm) to 50 ppm of ozone, preferably about 10 to about 15 ppm ozone, at a temperature of about 0° C. to about 60° C., preferably room temperature, for a period of at least about 0.1 minutes, preferably about 2 to about 10 minutes. Optionally, the ozonated water may additionally contain hydrochloric or nitric acid in a volume ratio ranging from about 1:1000 to 1:1 of acid:water.

If the ozonated bath is acid-free, the treated wafers may be immediately dried. If the ozonated bath contains hydrochloric or nitric acid, however, the treated wafers should be rinsed for a period of at least about 0.1 minutes and typically about 2 to about 10 minutes in deionized water having a resistivity of about 3 to about 18 mega-Ohms, preferably greater than about 17 mega-Ohms.

The final step in the pre-heat treatment cleaning process is drying the oxidized wafers. The wafers may be dried using any method which does not recontaminate the wafers with metals or other contaminants. Such methods include conventional spin drying and isopropyl alcohol vapor drying techniques which are well known in the field.

Ideally, the pre-heat treatment cleaning process is carried out in a conventional wet bench cleaning apparatus which comprises a series of tanks containing approximately 1 to 100 liters of flowing solution. In addition, the process is preferably controlled such that a cassette or cassettes holding a plurality of wafers, e.g., up to 100 wafers, is automatically transported to and immersed in the pre-cleaning bath, ozonated water bath, etc. All wetted parts are constructed of quartz, polyvinylchloride ("PVC"), polyvinylidenedifluoride ("PVDF"), polypropylene or teflon.

Upon completion of the pre-heat treatment cleaning process, the dried wafers are transferred to a furnace, rapid thermal annealer or other apparatus in which a thermal processing step is to be performed. Optimally, the drying station of the pre-heat treatment cleaning process is integrated with the thermal processing apparatus. That is, it is preferred that the wafers be transported directly from the drying station to the furnace to avoid recontamination of the wafers with metals or other contaminants. If a direct transfer is not practical, care should be taken to prevent the dried wafers from coming into contact with any apparatus or fluid which will contribute more than $1\times10^8$ atoms/cm$^2$ of iron, chromium, titanium and other metals which degrade minority carrier lifetime.

Typically, silicon wafers are subjected to oxygen donor annhilation annealing, thermal processes to control oxygen precipitation, low temperature CVD oxidation and nitridation, polysilicon deposition and other thermal process steps prior to being polished. In accordance with the present invention, therefore, these thermal steps can be carried out using wafers which have a relatively metal-free, hydrophilic surface to produce wafers having an improved minority carrier lifetime as compared to wafers which have been processed using conventional techniques.

Silicon dioxide is hydrophilic and easily wet by water, whereas a surface of silicon is hydrophobic. The degree of hydrophilicity or hydrophobicity can be determined by reference to the contact angle of a droplet of water placed on the surface. As used herein, a surface is considered to be hydrophilic if the contact angle is less than 30 degrees and hydrophobic if the contact angle is greater than 30 degrees. Preferably, the contact angle for the hydrophilic surfaces described herein is less than 10 degrees and, most preferably, the contact angle is about 3 to about 5 degrees.

Due to the analytical approach used to determine the concentration of metal on the surface of a hydrophilic wafer, the concentrations reported herein shall include the quantities of metal located on the surface of the silicon dioxide, metal incorporated in the silicon dioxide, and metal located at the silicon dioxide/silicon interface. Such methods for determining the surface contamination of silicon are well known to those of ordinary skill. For example, the surface metal content of silicon may be determined as set forth in Ruth, K., Schmidt, P., Coria, J., and Mori, E., *Proceedings of the ECS Fall Meeting,* Electrochemical Society 1993 (Vol. II) p. 488, the disclosure of which is incorporated herein by reference.

Various techniques may be used to measure the minority carrier recombination lifetime (or minority carrier diffusion length) of a silicon wafer and typically involve injecting carriers into a wafer sample by means of a flash of light or voltage pulses and observing their decay. One process for measuring minority carrier recombination lifetime is the surface photovoltage (SPV) technique described in Zoth and Bergholz, *J. Appl. Phys.,* 67, 6764 (1990). Alternatively, diffusion length may be measured using an ELYMAT instrument manufactured by GeMeTec (Munich, Germany) which measures to a resolution of about 1 mm the photocurrents generated by a scanning laser beam and collected by a dilute HF electrolytic function. Minority carrier diffusion lengths are calculated from these data and diffusion length images can be generated. See, e.g., H. Foell et al., Proc. ESSDERC Conference, Berlin 1989, p. 44. The calculated diffusion length values are readily converted to minority carrier recombination lifetime values using known formulas.

The following Example illustrates the invention.

EXAMPLE

A cleaning process was carried out on smooth, acid-etched P⁻ type silicon wafers having a resistivity of 0.8–1.1 ohm-cm using a conventional wet bench cleaning apparatus. The cleaning sequence for one set of the wafers (set "A") was as follows:

1. 10 minutes in an SC-1 batch (1:10:50 $NH_4OH:H_2O_2:H_2O$) with megasonics at 70° C.;
2. water rinse for 5 minutes;
3. 5 minutes in a metals removal solution (1:10:100 $HF:HCl:H_2O$);
4. overflow water rinse for 5 minutes;
5. immersion in flowing ozonated water bath (14 ppm $O_3$; metals each less than 0.01 ppb) for 5 minutes;
6. IPA (isopropylalcohol) dried for 10 minutes; and
7. Processed through a rapid thermal annealer (750° C. for 4 seconds) in a nitrogen atmosphere.

A second set of wafers (set "B") were subjected to steps 1–4 and 7 (except for the megasonics in step 1).

The wafers of sets A and B were analyzed for the surface density of iron by acid drop/inductively coupled plasma/mass spectroscopy, for minority carrier lifetime by Elymat and for minority carrier diffusion length by SPV. The results are reported in Table I.

TABLE I

|  | Set A | Set B |
|---|---|---|
| iron density (atoms/cm$^2$) | $8 \times 10^8$ | $1 \times 10^9$ |
| diffusion length (microns) | 450 | 460 |
| lifetime (microseconds) | >350 | >200 |

While certain representative embodiments and details have been shown for the purpose of describing the invention, it will be apparent to those skilled in the art that various changes and modifications may be made therein without departing from the scope of the invention.

What is claimed is:

1. A process for heat-treating a silicon wafer comprising:

contacting the surface of the silicon wafer with an aqueous solution containing hydrofluoric acid to remove metals from the wafer surface, contacting the hydrofluoric acid treated wafer with ozonated water to grow a hydrophilic oxide layer on the surface of the silicon wafer, and heating the ozonated water treated wafer to a temperature of at least about 300° C. for a duration of at least about 1 second, the concentration of each of iron, chromium, calcium, titanium, cobalt, manganese, zinc and vanadium, on the surface of the silicon wafer at the initiation of the heating being less than $1 \times 10^9$ atoms/cm$^2$.

* * * * *